(12) United States Patent
Huang et al.

(10) Patent No.: US 8,093,082 B2
(45) Date of Patent: Jan. 10, 2012

(54) METHOD OF FABRICATING PHOTOELECTRIC DEVICE OF GROUP III NITRIDE SEMICONDUCTOR AND STRUCTURE THEREOF

(75) Inventors: Shih Cheng Huang, Hsinchu (TW); Po Min Tu, Chiayi County (TW); Ying Chao Yeh, Taipei County (TW); Wen Yu Lin, Taichung County (TW); Peng Yi Wu, Taichung (TW); Chih Peng Hsu, Tainan County (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 266 days.

(21) Appl. No.: 12/396,750

(22) Filed: Mar. 3, 2009

(65) Prior Publication Data

US 2009/0224283 A1    Sep. 10, 2009

(30) Foreign Application Priority Data

Mar. 5, 2008 (TW) .................................. 97107609 A

(51) Int. Cl.
*H01L 21/00* (2006.01)

(52) U.S. Cl. ............. 438/46; 257/E21.22; 257/E21.131; 438/22; 438/24

(58) Field of Classification Search .................... 438/46
See application file for complete search history.

(56) References Cited

U.S. PATENT DOCUMENTS

| 6,071,795 | A | 6/2000 | Cheung et al. |
|---|---|---|---|
| 6,417,075 | B1 | 7/2002 | Haberger et al. |
| 6,617,261 | B2 | 9/2003 | Wong et al. |
| 6,740,604 | B2 | 5/2004 | Kelly et al. |
| 6,746,889 | B1 | 6/2004 | Eliashevich et al. |
| 2004/0251519 | A1* | 12/2004 | Sugahara et al. ............. 257/615 |
| 2007/0231963 | A1* | 10/2007 | Doan et al. .................... 438/107 |

FOREIGN PATENT DOCUMENTS

| JP | 2005-209925 | A | 8/2005 |
|---|---|---|---|
| WO | WO2007145679 | * | 2/2007 |

* cited by examiner

*Primary Examiner* — David Vu
*Assistant Examiner* — Mohammad Choudhry
(74) *Attorney, Agent, or Firm* — Altis Law Group, Inc.

(57) ABSTRACT

A method of fabricating a photoelectric device of Group III nitride semiconductor, where the method comprises the steps of: forming a first Group III nitride semiconductor layer on a surface of a temporary substrate; patterning the first Group III nitride semiconductor layer using photolithography and etching processes; forming a second Group III nitride semiconductor layer on the patterned first Group III nitride semiconductor layer; forming a conductive layer on the second Group III nitride semiconductor layer; and releasing the temporary substrate by removing the first Group III nitride semiconductor layer to obtain a composite of the second Group III nitride semiconductor layer and the conductive layer.

4 Claims, 12 Drawing Sheets

METHOD OF FABRICATING PHOTOELECTRIC DEVICE OF GROUP III NITRIDE SEMICONDUCTOR AND STRUCTURE THEREOF

BACKGROUND OF THE INVENTION

1. Field of the Invention

The present invention relates to the structure and fabricating method of a photoelectric device of Group III nitride semiconductor, and relates more particularly to the light emitting structure of a photoelectric device and the fabricating method thereof.

2. Description of the Related Art

To date, light emitting diodes made of gallium nitride material or Group III nitride semiconductor material are built upon a sapphire substrate mainly because the degree of lattice mismatch between sapphire and Group III nitride semiconductor material is low (normally, a buffer layer is still required to improve the mismatch therebetween). However, sapphire substrates have many disadvantages, such as high insulation characteristics, and due to such characteristics it is difficult for a light emitting diode made of Group III nitride semiconductor material to have a vertical conductive structure. Therefore, the technology using other substrate materials, for example silicon carbide material, to reduce such disadvantages continues to be developed. Due to its greater conductivity, silicon carbide can be used to produce a conductive substrate, and because the degree of lattice match between silicon carbide and Group III nitride active layer is low, using a buffer layer made of gallium nitride or aluminum gallium nitride, a Group III nitride semiconductor layer can be deposited on a silicon carbide substrate. Moreover, due to the high stability of silicon carbide, silicon carbide is becoming more important in such manufacturing processes. Although a Group III nitride semiconductor layer can be deposited on a silicon carbide substrate with the help of a buffer layer made of gallium nitride or aluminum gallium nitride, the degree of lattice match between a Group III nitride semiconductor material and silicon carbide, which is lower than the degree of lattice match between aluminum gallium nitride and silicon carbide, often causes defects in an expitaxial layer even where the buffer layer made of gallium nitride or aluminum gallium nitride is formed on a silicon carbide substrate, and furthermore, a silicon carbide substrate is more expensive.

FIG. 1A and FIG. 1B show a method of separating a thin film from a growth substrate, disclosed in U.S. Pat. No. 6,071,795. The method initially forms a separation region 12 and a silicon nitride layer 13 on a sapphire substrate 11, and then a bonding layer 14 is disposed on the surface of the silicon nitride layer 13. Next, with the help of the bonding layer 14, a silicon substrate 15 is bonded to the above-mentioned sapphire substrate 11 with a stacked-layer structure. A laser beam 16 penetrating the sapphire substrate 11 is applied on the separation region 12, and causes the separation region 12 to decompose. Finally, the remnant material of the decomposed separation region 12 is cleared to obtain a composite including the silicon substrate 15 and the silicon nitride layer 13. However, because the bonding layer 14 between the silicon substrate 15 and the silicon nitride layer 13 is dielectric, the composite cannot be a basis for building a vertical structure light emitting diode. Moreover, if the material for the bonding layer is disposed incorrectly or selected improperly, the bonding is affected, and defects are formed in the silicon nitride layer 13.

FIG. 2 shows a method of separating two layers of material from one another, disclosed in U.S. Pat. No. 6,740,604. The technology used for the disclosure related to FIG. 2 is similar to the technology for the disclosure related to FIGS. 1A-1B. A laser beam 23 is applied on the interface between a first semiconductor layer 21 and a second semiconductor layer 22, and initiates the decomposition of the second semiconductor layer 22 at the interface. Finally, the first semiconductor layer 21 is separated from the second semiconductor layer 22. The second semiconductor layer 22 can be the film layer formed on a substrate. In such process, a substrate replaces the first semiconductor layer 21, and then both are separated.

FIG. 3 shows a structure prior to separation of the substrate, disclosed in U.S. Pat. No. 6,746,889. The method initially grows several epitaxial layers, which comprise the first region 32 of a first conductivity type, a light-emitting p-n junction 33, and the second region 34 of a second conductivity type, on a substrate 31. Next, several sawing streets 36 are cut through the epitaxial layers of the first region 32, second junction 33 and region 34 to have a plurality of individual optoelectronic devices or dies 35 formed on the substrate 31. Thereafter, the second region 34 is bonded to a submount 37. As shown in the above mentioned prior art technology, a laser beam, in the same manner, penetrating the substrate 31 causes the substrate 31 to separate from the first region 32. Separated optoelectronic devices or dies 35 can be removed from the submount 37 and proceed through the packaging processes. Obviously, when the epitaxial layers are cut through, individual optoelectronic devices or dies 35 bonded to the submount 37 squeeze one another by external forces such that die cracks may occur.

FIG. 4 is a side view of the laser lift-off process for removing a sapphire substrate, disclosed in U.S. Pat. No. 6,617,261. A gallium nitride 42 is initially formed on a sapphire substrate 41, and then a plurality of trenches 44 are formed by etching process. Next, a silicon substrate 43 is bonded to the surface where the gallium nitride layer 42 is formed and then is etched to form the trenches 44. Thereafter, an ultraviolet excimer laser 45 emits a laser beam 46 onto the sapphire substrate 41. The laser beam 46 penetrates the transparent sapphire substrate 41 to cause the gallium nitride at the interface to decompose so as to obtain a silicon substrate 43 bonded with the gallium nitride layer 42. Any residual gallium metal on the surface of the gallium nitride layer 42 is removed by hydrochloric acid. The surface of the gallium nitride layer 42 needs to further repair for sequent epitaxial processes.

Conventional technologies use high-energy laser beams to separate substrates or light emitting dies. However, those technologies have low throughput and require expensive equipment to apply. Therefore, a new separation technology that has none of the above-mentioned issues, can guarantee the quality of produced light emitting dies, and can be applied for mass production is required by the market.

SUMMARY OF THE INVENTION

The primary aspect of the present invention is to provide a photoelectric device of Group III nitride semiconductor and a fabricating method thereof. The method employs a dielectric temporary substrate as a base for epitaxy, which is then removed to obtain a photoelectric device of Group III nitride semiconductor having a vertical conductive structure.

Another aspect of the present invention is to provide a photoelectric device of Group III nitride semiconductor and the fabricating method thereof. The method can be performed using conventional processes and equipment so as to minimize manufacturing cost.

In view of the above aspects, the present invention proposes a method of fabricating a photoelectric device of Group III nitride semiconductor, wherein the method comprises the steps of: forming a first Group III nitride semiconductor layer on a surface of a temporary substrate; patterning the first Group III nitride semiconductor layer using photolithography and etching processes; forming a second Group III nitride semiconductor layer on the patterned first Group III nitride semiconductor layer; forming a conductive layer on the second Group III nitride semiconductor layer; and releasing the temporary substrate by removing the first Group III nitride semiconductor layer to obtain a composite of the second Group III nitride semiconductor layer and the conductive layer.

According to one embodiment, the step of patterning the first Group III nitride semiconductor layer further comprises the steps of: forming a patterned dielectric mask layer on the first Group III nitride semiconductor layer; etching the unmasked portion of the first Group III nitride semiconductor layer; and removing the dielectric mask layer, wherein the dielectric mask layer is a photoresist layer.

According to one embodiment, the method further comprises a step of forming a metal mirror layer disposed between the second Group III nitride semiconductor layer and the conductive layer. According to one embodiment, the method further comprises a step of forming an N-type semiconductor layer, an active layer, and a P-type semiconductor layer between the second Group III nitride semiconductor layer and the metal mirror layer.

According to one embodiment, the conductive layer is formed by electroplating or electrochemically depositing copper or nickel.

According to one embodiment, the method further comprises a step of removing remnants of the first Group III nitride semiconductor layer on the second Group III nitride semiconductor layer. The first Group III nitride semiconductor layer is removed by dry etching process or wet etching process.

According to one embodiment, the material of the temporary substrate comprises sapphire, silicon carbide, silicon, zinc oxide, magnesium oxide, and gallium arsenide.

According to one embodiment, the first Group III nitride semiconductor layer is decomposed under laser exposure so as to release the temporary substrate from the composite of the second Group III nitride semiconductor layer and the conductive layer.

According to one embodiment, the patterned first Group III nitride semiconductor layer comprises a plurality of protruding portions and a plurality of trenches among the protruding portions. The protruding portion may be a hexagonal cylinder, a circular cylinder, or a rectangular cylinder, and the trenches are around the protruding portions. The protruding portion can be thin and elongated, and the trenches separate the protruding portions.

The present invention proposes a photoelectric device of Group III nitride semiconductor, which comprises a Group III nitride semiconductor layer, a metal mirror layer formed on the Group III nitride semiconductor layer; and a conductive layer formed on the metal mirror layer.

According to one embodiment, the material of the Group III nitride semiconductor layer is $Al_xIn_yGa_{1-x-y}N$, wherein $0 \leq x \leq 1$ and $0 \leq y \leq 1$.

According to one embodiment, the conductive layer is formed by electroplating or electrochemically depositing copper (Cu), nickel (Ni) or copper-tungsten (CuW).

According to one embodiment, an N-type semiconductor layer, an active layer, and a P-type semiconductor layer are formed between the second Group III nitride semiconductor layer and the metal mirror layer.

BRIEF DESCRIPTION OF THE DRAWINGS

The invention will be described according to the appended drawings in which.

DETAILED DESCRIPTION OF THE INVENTION

Figure 1A:
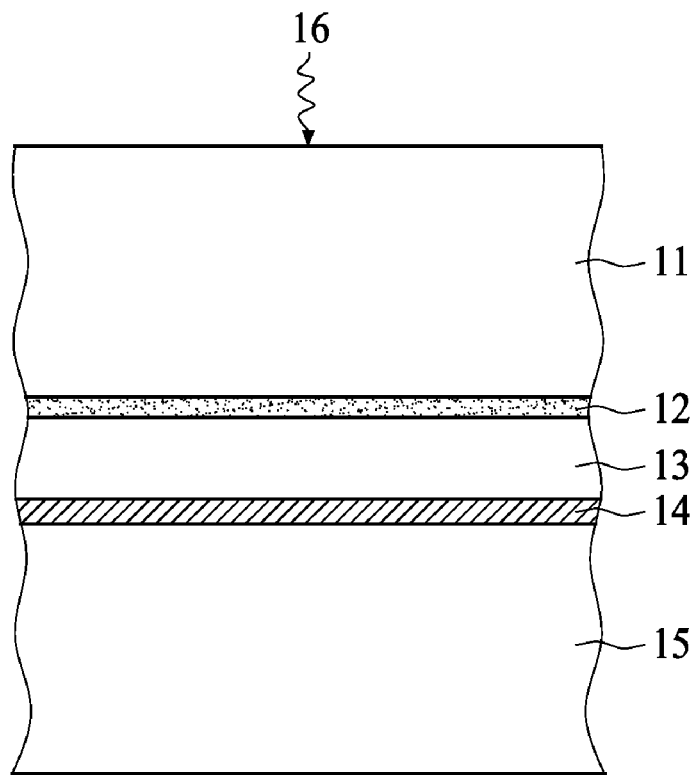
FIGS. 1A and 1B show a method of separating a thin film from a growth substrate, disclosed in U.S. Pat. No. 6,071,795.
Figure 1B:
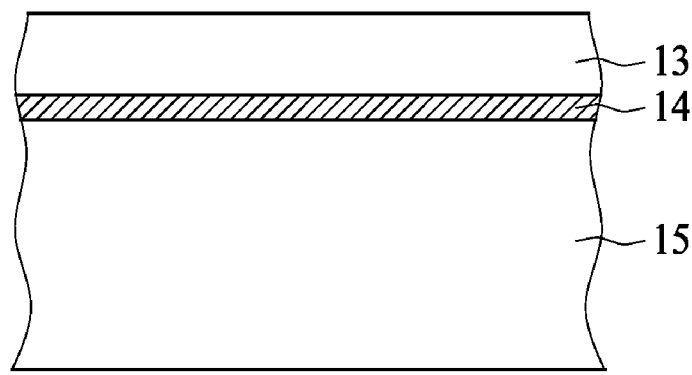
Figure 2:
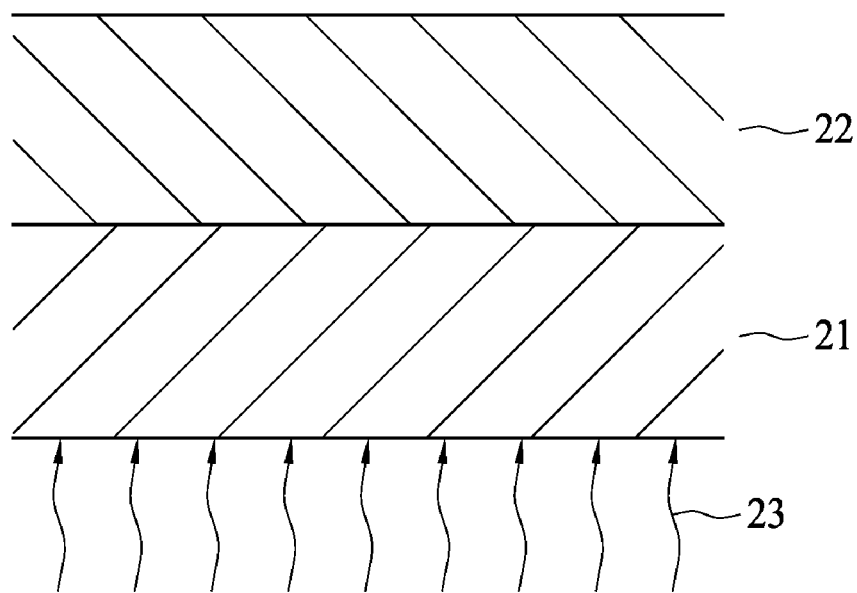
FIG. 2 shows a method of separating two layers of material from one another, disclosed in U.S. Pat. No. 6,740,604.
Figure 3:
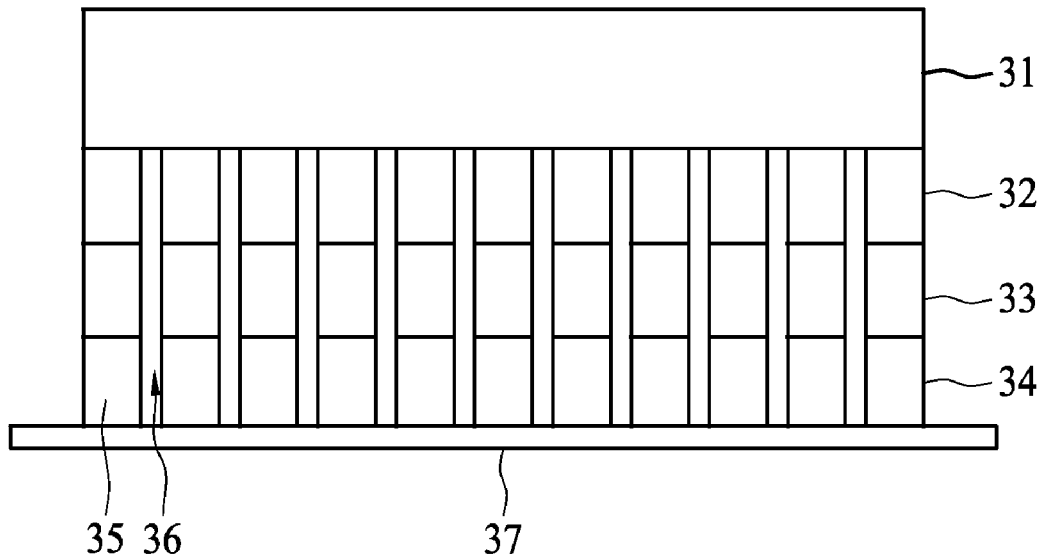
FIG. 3 shows a structure before a substrate is separated, disclosed in U.S. Pat. No. 6,746,889.
Figure 4:
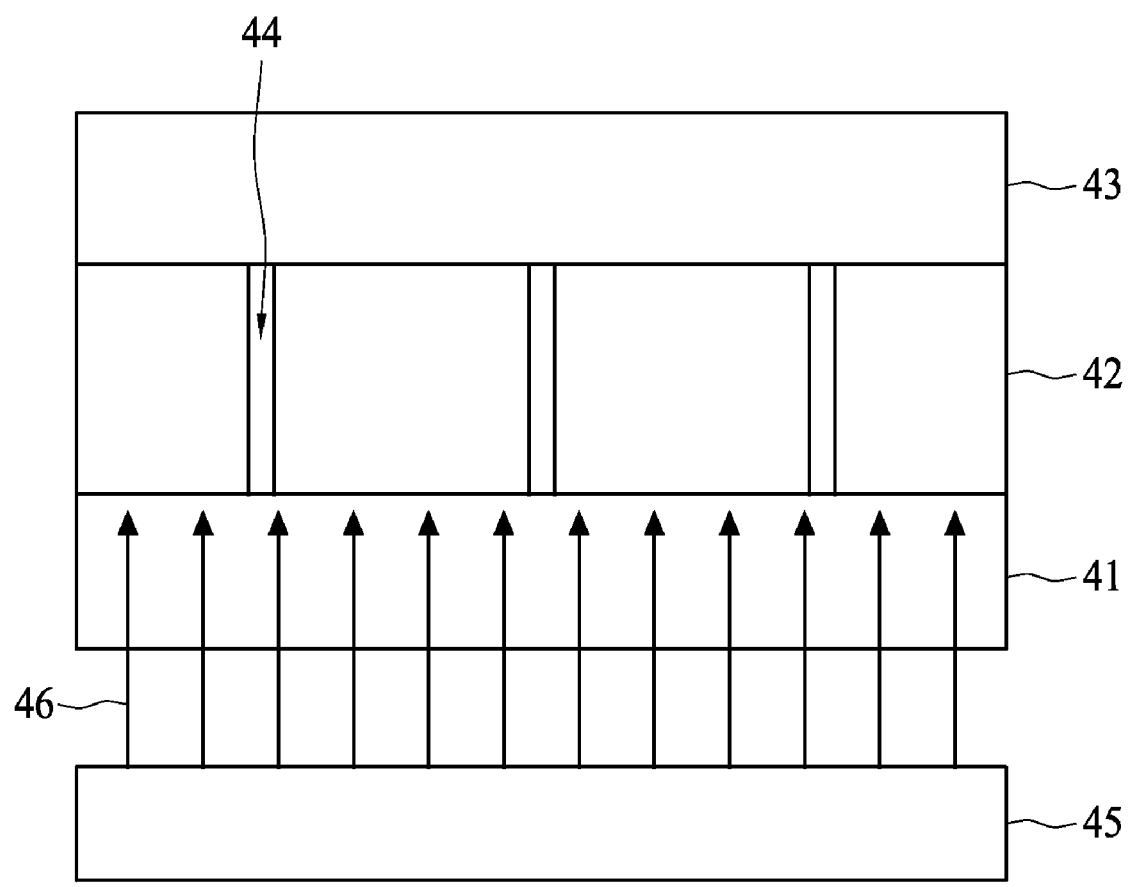
FIG. 4 is a side view of the laser lift-off process for removing a sapphire substrate, disclosed in U.S. Pat. No. 6,617,261.
Figure 5:
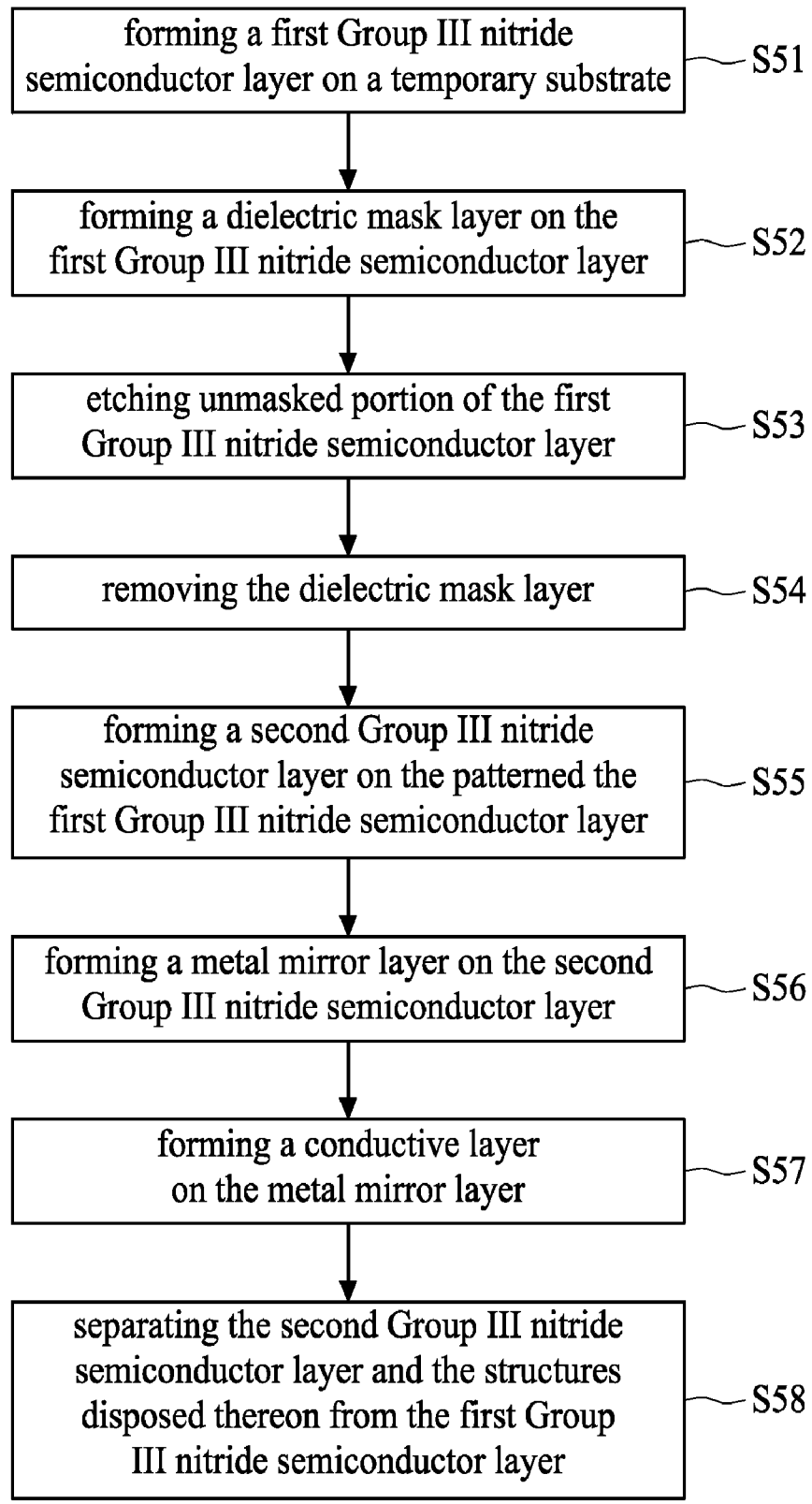
FIG. 5 is a flow chart showing a process for fabricating a photoelectric device of Group III nitride semiconductor according to one embodiment of the present invention.

FIG. 5 is a flow chart showing a process for fabricating a photoelectric device of Group III nitride semiconductor according to one embodiment of the present invention. In Step S51, a first Group III nitride semiconductor layer is formed on a surface of a temporary substrate, such as a sapphire substrate (i.e. aluminum oxide, $Al_2O_3$), silicon carbide (SiC) substrate, silicon substrate, zinc oxide (ZnO) substrate, magnesium oxide (MgO) substrate, gallium arsenide (GaAs) substrate, etc. Then, in Step S52 and Step S54, using photolithography and etching process, a patterned dielectric mask layer, for example a photoresist layer, is formed on the first Group III nitride semiconductor layer; the unmasked portion of the first Group III nitride semiconductor layer is etched out; the dielectric mask layer is removed and a first Group III nitride semiconductor layer having the same pattern of the dielectric mask is obtained.

In Step S55, a second Group III nitride semiconductor layer is formed on the patterned first Group III nitride semiconductor layer. A metal mirror layer is formed on the second Group III nitride semiconductor layer in Step S56. In Step S57, a conductive layer is formed on the metal mirror layer. For example, a copper (Cu), nickel (Ni) or copper-tungsten (CuW) layer is deposited on the metal mirror layer by electroplating or electro-chemical processes. In Step S58, etching process is used to separate the second Group III nitride semiconductor layer, metal mirror layer, and the conductive layer from the first Group III nitride semiconductor layer, or a laser beam is delivered to the transparent temporary substrate to decompose the first Group III nitride semiconductor layer.

FIGS. 6A-6I are schematic diagrams illustrating a process for fabricating a photoelectric device of Group III nitride semiconductor according to one embodiment of the present invention. A first Group III nitride semiconductor layer 62 is formed on the surface of a temporary substrate 61, and a patterned dielectric mask layer 63 is formed on the Group III nitride semiconductor layer 62. The portion of the first Group III nitride semiconductor layer 62, unmasked by the dielectric mask layer 63, is removed by etching process, and then the dielectric mask layer 63 is removed such that a first Group III nitride semiconductor layer 62' having the same pattern as the dielectric mask is obtained, referring to FIG. 6D. Next, a second Group III nitride semiconductor layer 64 is formed on the first Group III nitride semiconductor layer 62', and a metal mirror layer 65 is formed on the second Group III nitride semiconductor layer 64. The metal mirror layer 65 is selectable. According to packaging methods, the metal mirror layer 65 can be used to reflect light beams. An N-type semiconductor layer, an active layer, and a P-type semiconductor layer are selectably formed on the second Group III nitride semiconductor layer 64, and then the metal mirror layer 65 is formed.

Figure 6A:
FIGS. 6A-6I are schematic diagrams illustrating a process for fabricating a photoelectric device of Group III nitride semiconductor according to one embodiment of the present invention.
Figure 6B:
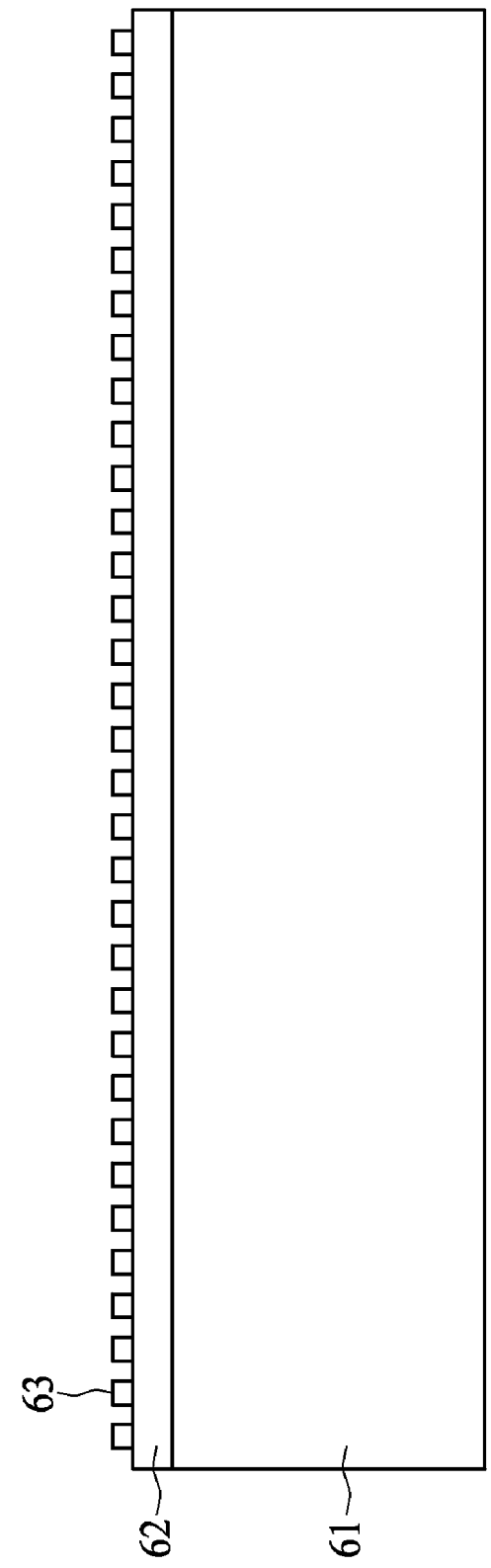
Figure 6C:
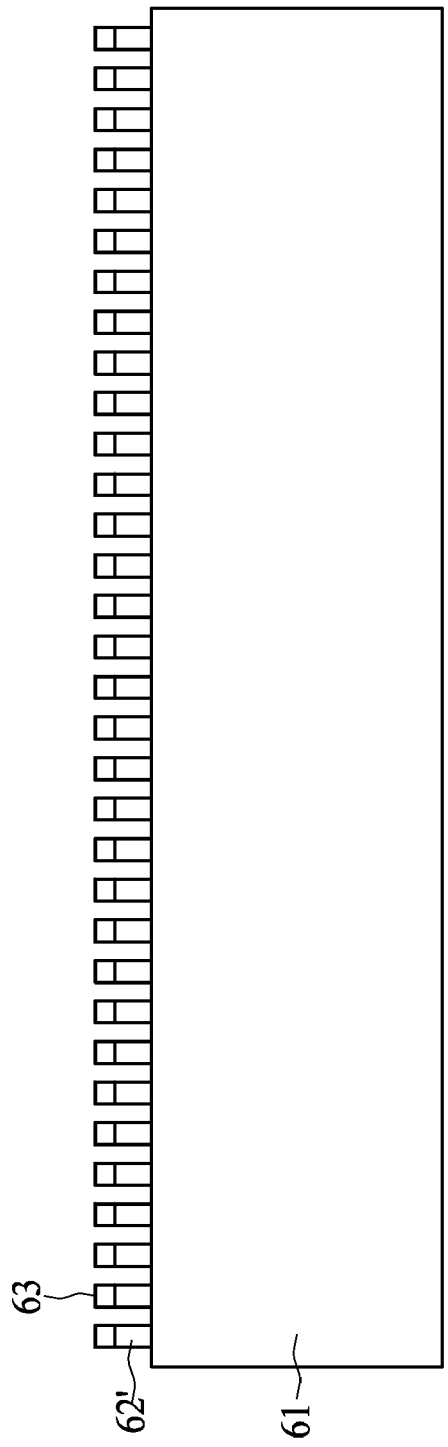
Figure 6D:
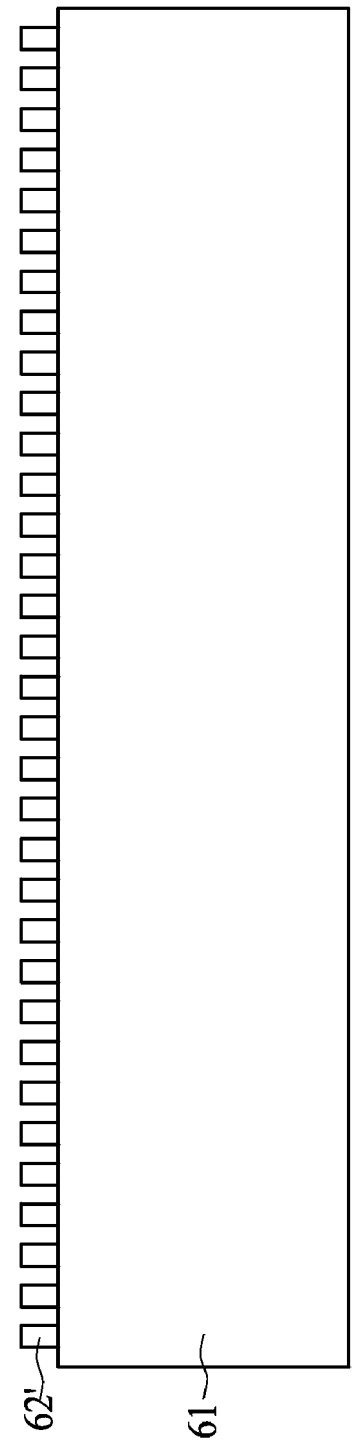
Figure 6E:
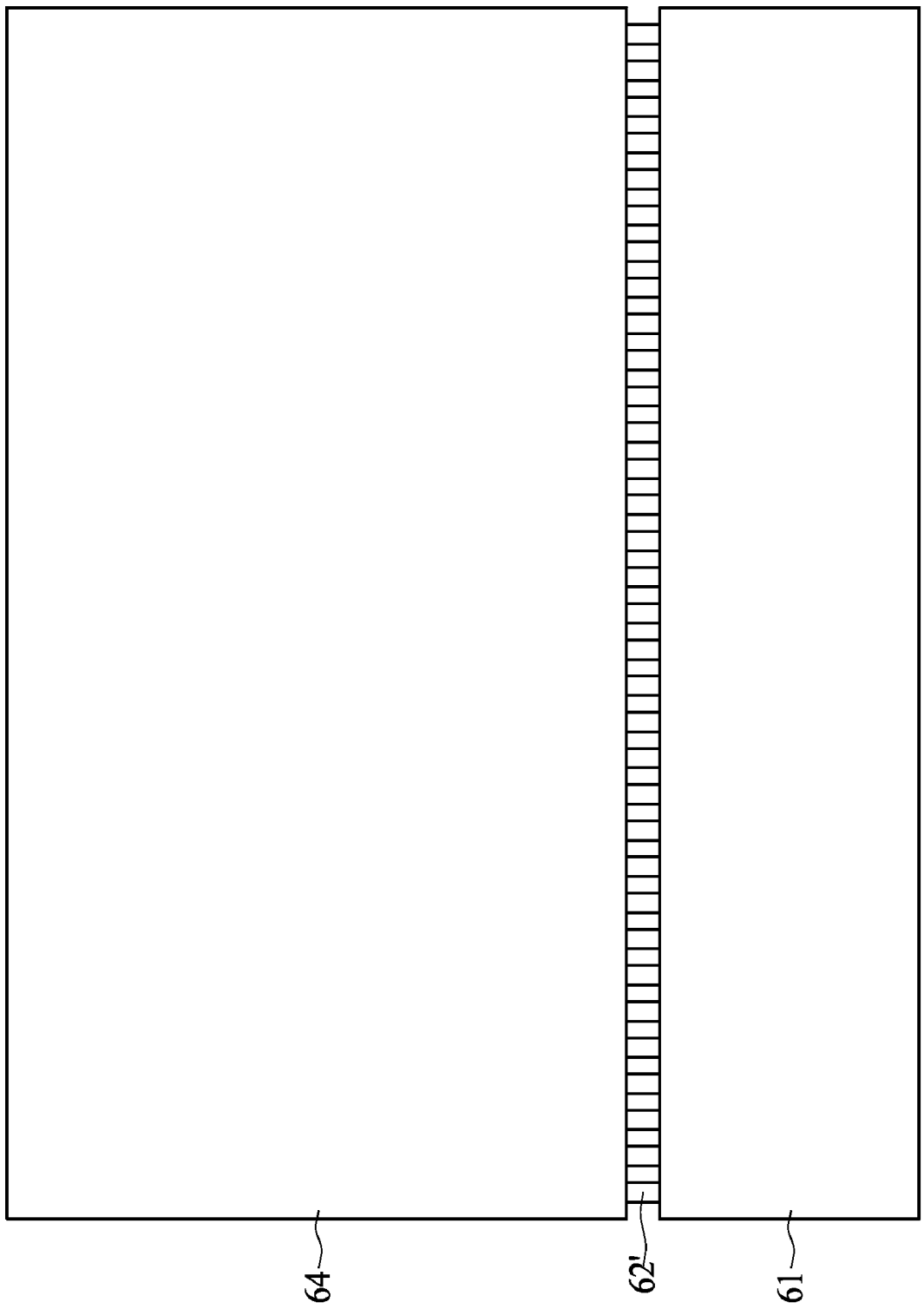
Figure 6F:
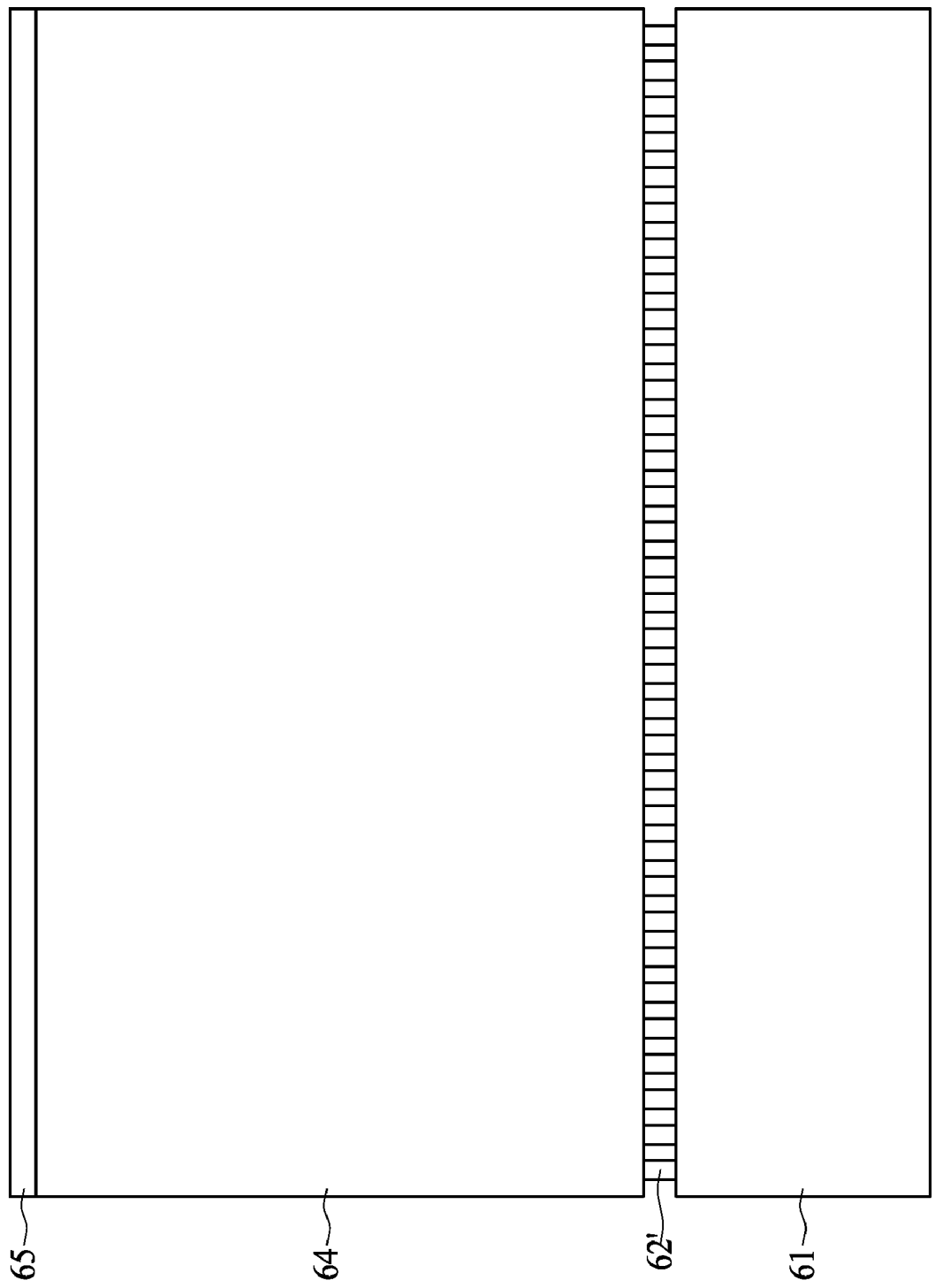
Figure 6G:
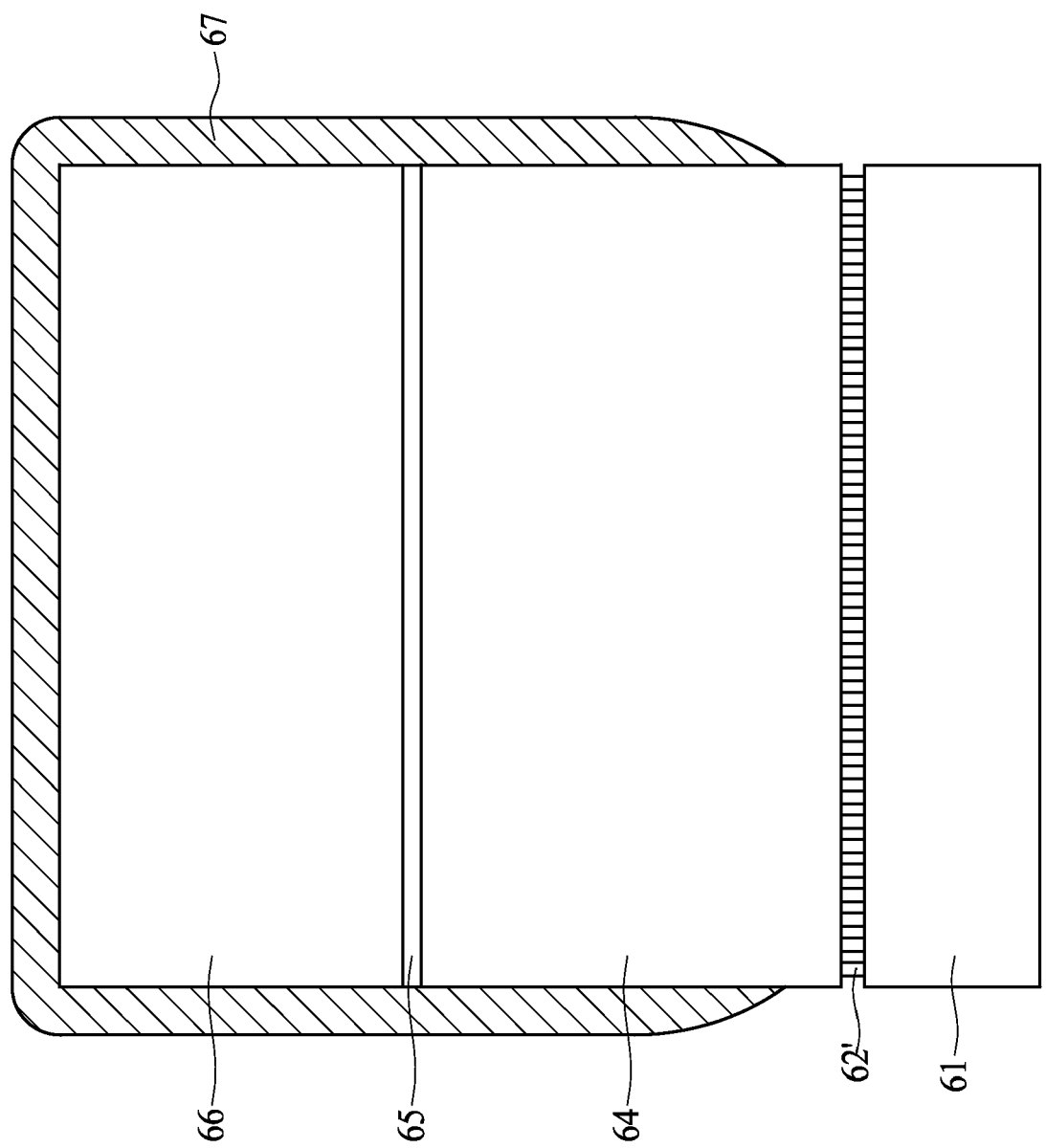
Figure 6H:
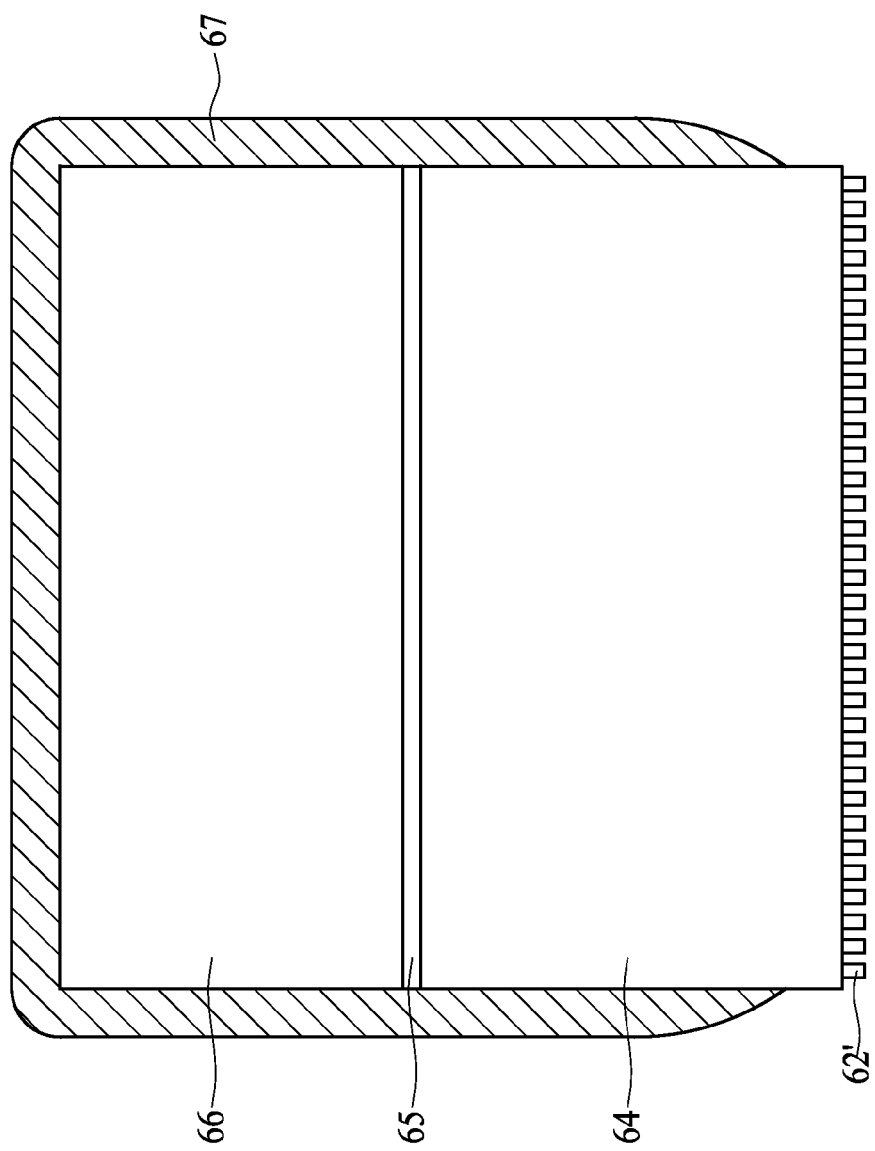
Figure 6I:
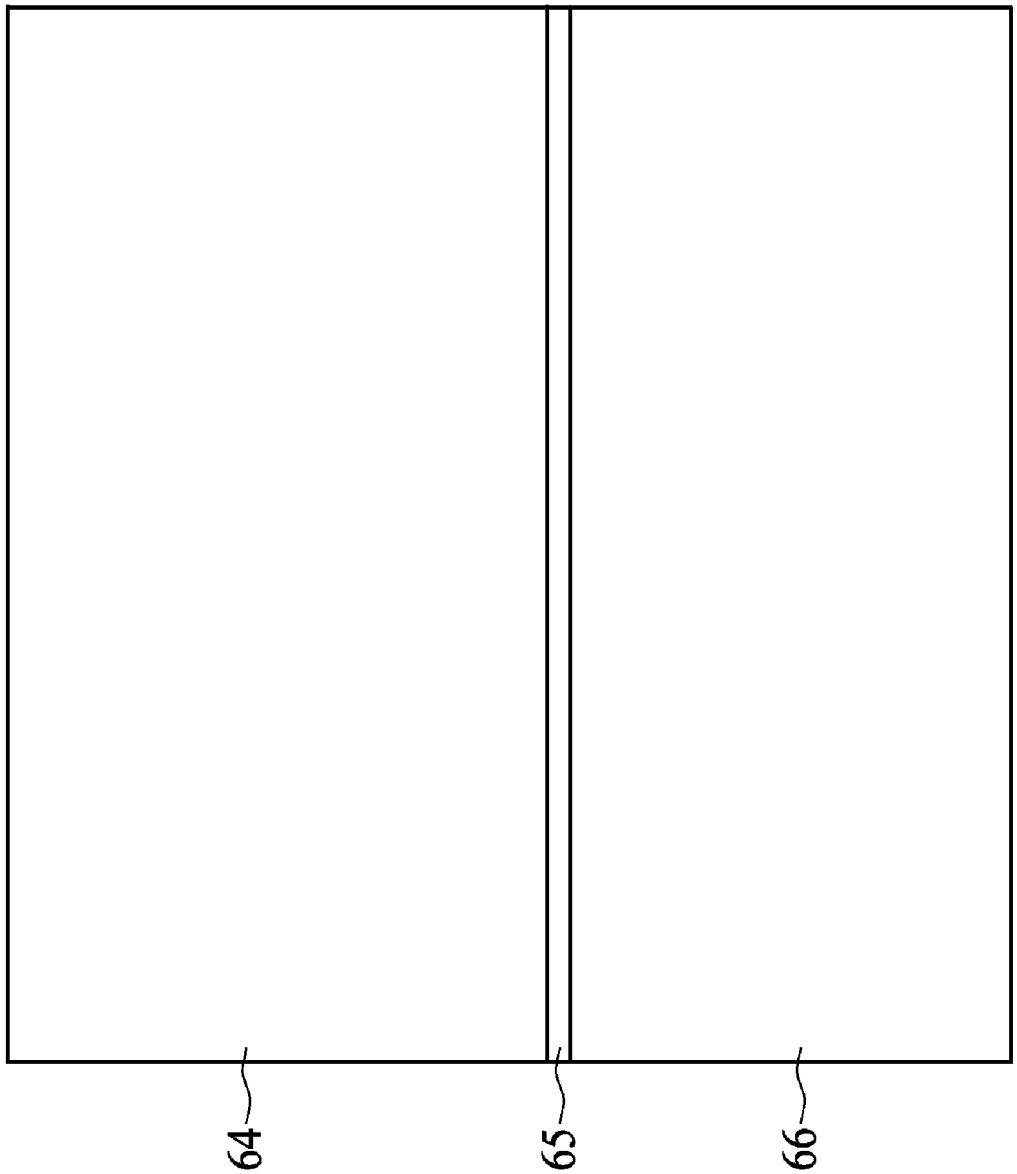

As shown in FIG. 6G, a conductive layer 66 is deposited on the metal mirror layer 65, and an etching protection layer 67, for example a silicon dioxide ($SiO_2$) layer, covers the conductive layer 66 and the metal mirror layer 65. Then, an etchant is brought into the trenches of the first Group III nitride semiconductor layer 62', and using the etchant, the first Group III nitride semiconductor layer 62' is separated from the temporary substrate 61. Under the protection of the etching protection layer 67, the conductive layer 66 and the metal mirror layer 65 will not be exposed to the etchant so as to avoid damage. The surface of the second Group III nitride semiconductor layer 64 may have some residual first Group III nitride semiconductor layer 62', and therefore, a wet etching process is performed to remove the remnants of the first Group III nitride semiconductor layer 62', as shown in FIG. 6I. Thereafter, the etching protection layer 67 is removed by another etching process. The material of the first Group III nitride semiconductor layer 62 and the second Group III nitride semiconductor layer 64 is $Al_xIn_yGa_{1-x-y}N$, wherein $0 \leq x \leq 1$ and $0 \leq y \leq 1$ and such material help the epitaxy of the silicon doped N-type gallium nitride layer. The second Group III nitride semiconductor layer 64 can include a light emitting structure, and specifically can include an N-type semiconductor layer, an active layer (light emitting layer), and a P-type semiconductor layer, or a light emitting structure can be formed on the second Group III nitride semiconductor layer 64.

Figure 7A:
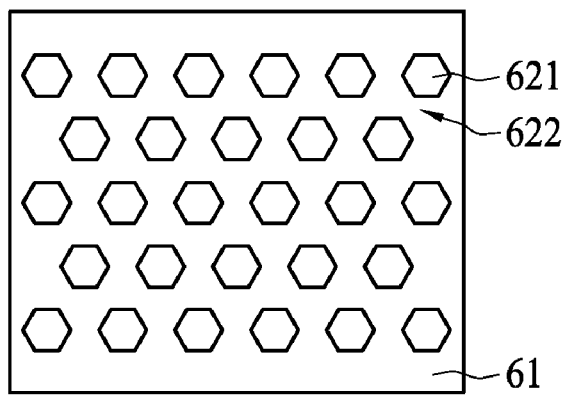
FIGS. 7A-7D are schematic diagrams illustrating a process for patterning a first Group III nitride semiconductor layer according to one embodiment of the present invention.
Figure 7B:
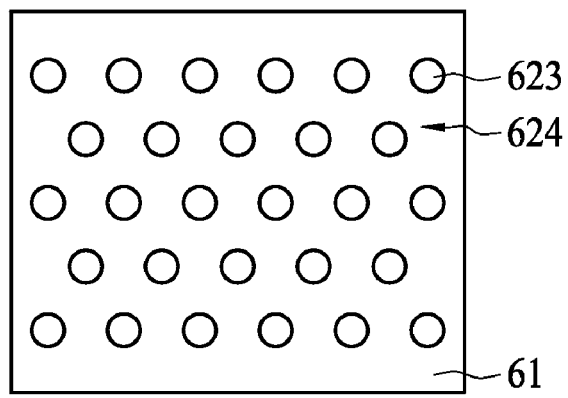
Figure 7C:
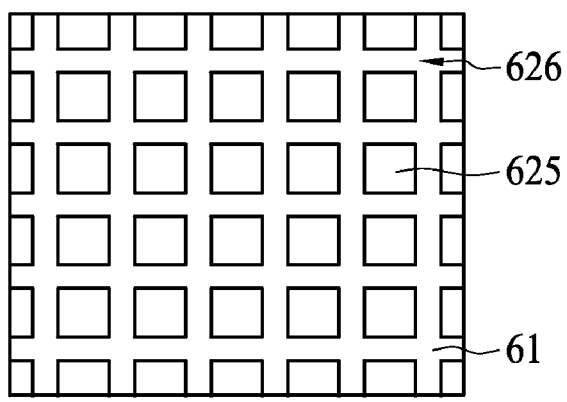
Figure 7D:
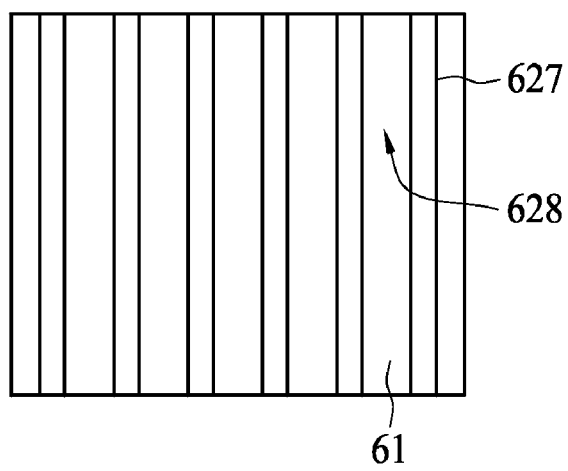

FIGS. 7A-7D are schematic diagrams illustrating a process for patterning a first Group III nitride semiconductor layer according to one embodiment of the present invention. As shown in FIG. 7A, the first Group III nitride semiconductor layer 62 can be etched to have a plurality of hexagonal cylinders 621 and a plurality of trenches 622 connected together. As shown in FIG. 7B, the first Group III nitride semiconductor layer 62 can be etched to have a plurality of circular cylinders 623 and a plurality of trenches 624 connected together. As shown in FIG. 7C, the first Group III nitride semiconductor layer 62 can be etched to have a plurality of rectangular cylinders 625 and a plurality of trenches 626 connected together. As shown in FIG. 7D, the first Group III nitride semiconductor layer 62 can be etched to have a plurality of protruding portions 627 and a plurality of trenches 628 separating the protruding portions 627, and the protruding portion 627 can have a thin, elongated shape.

The above-described embodiments of the present invention are intended to be illustrative only. Numerous alternative embodiments may be devised by persons skilled in the art without departing from the scope of the following claims.

What is claimed is:

1. A method for fabricating a photoelectric device of $Al_xIn_yGa_{1-x-y}N$ semiconductor, comprising steps of:
   forming a first $Al_xIn_yGa_{1-x-y}N$ semiconductor layer on a surface of a temporary substrate;
   forming a patterned dielectric mask layer on the first $Al_xIn_yGa_{1-x-y}N$ semiconductor layer;
   etching unmasked portion of the first $Al_xIn_yGa_{1-x-y}N$ semiconductor layer;
   removing the dielectric mask layer thereby patterning the first $Al_xIn_yGa_{1-x-y}N$ semiconductor layer by using photolithography and etching processes;
   forming a second $Al_xIn_yGa_{1-x-y}N$ semiconductor layer on the patterned first $Al_xIn_yGa_{1-x-y}N$ semiconductor layer;
   forming an N-type semiconductor layer, an active layer, and a P-type semiconductor layer on the second $Al_xIn_yGa_{1-x-y}N$ semiconductor layer;
   forming a metal mirror layer on the P-type semiconductor layer, whereby the N-type semiconductor layer, the active layer, and the P-type semiconductor layer are located between the second $Al_xIn_yGa_{1-x-y}N$ semiconductor layer and the metal mirror layer;
   forming a copper-tungsten conductive layer on the metal mirror layer;
   disposing an etching protection layer on the copper-tungsten conductive layer and the metal mirror layer;
   releasing the temporary substrate by removing the first $Al_xIn_yGa_{1-x-y}N$ semiconductor layer by etching; and
   removing remnants of the first $Al_xIn_yGa_{1-x-y}N$ semiconductor layer by wet etching process to obtain a composite of the second $Al_xIn_yGa_{1-x-y}N$ semiconductor layer, the N-type semiconductor layer, the active layer, and the P-type semiconductor layer, the metal mirror layer and the copper-tungsten conductive layer;
   wherein a material of the temporary substrate comprises one of zinc oxide and magnesium oxide;
   wherein the patterned dielectric mask layer is a photoresist layer; and
   wherein $0 < x < 1$ and $0 < y < 1$.

2. The method of claim 1, wherein the patterned first $Al_xIn_yGa_{1-x-y}N$ semiconductor layer comprises a plurality of protruding portions and a plurality of trenches among the protruding portions.

3. The method of claim 2, wherein the protruding portion is a hexagonal cylinder or a circular cylinder and the trenches surround the protruding portions.

4. The method of claim 2, wherein the protruding portion is thin and elongated, and the trenches separate the protruding portions.

* * * * *